(12) United States Patent
Hwang

(10) Patent No.: US 10,141,289 B2
(45) Date of Patent: Nov. 27, 2018

(54) SEMICONDUCTOR PACKAGES HAVING PACKAGE-ON-PACKAGE STRUCTURES

(71) Applicant: Samsung Electronics Co., Ltd., Suwon-si (KR)

(72) Inventor: Taejoo Hwang, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 7 days.

(21) Appl. No.: 15/160,143

(22) Filed: May 20, 2016

(65) Prior Publication Data

US 2016/0322338 A1 Nov. 3, 2016

Related U.S. Application Data

(62) Division of application No. 14/178,747, filed on Feb. 12, 2014.

(30) Foreign Application Priority Data

Apr. 1, 2013 (KR) .................. 10-2013-0035310

(51) Int. Cl.
*H01L 23/02* (2006.01)
*H01L 25/10* (2006.01)
(Continued)

(52) U.S. Cl.
CPC ............ *H01L 25/105* (2013.01); *H01L 24/19* (2013.01); *H01L 25/07* (2013.01); *H01L 25/18* (2013.01); *H01L 25/50* (2013.01); *H01L 2224/12105* (2013.01); *H01L 2224/16225* (2013.01); *H01L 2224/73253* (2013.01); *H01L 2225/1023* (2013.01); *H01L 2225/1041* (2013.01); *H01L 2225/1058* (2013.01);
(Continued)

(58) Field of Classification Search
CPC ..... H01L 2924/15311; H01L 2924/181; H01L 2224/73204; H01L 2224/32145; H01L 24/73; H01L 2225/1023; H01L 24/97
USPC .......... 257/686, E21.499, E21.502, E23.011, 257/E25.013
See application file for complete search history.

(56) References Cited

U.S. PATENT DOCUMENTS 6,489,217 B1 12/2002 Kalnitsky et al.
6,875,921 B1 4/2005 Conn
(Continued)

FOREIGN PATENT DOCUMENTS

JP 2004-335915 11/2004
JP 2007-278901 10/2007
(Continued)

*Primary Examiner* — David Chen
(74) *Attorney, Agent, or Firm* — Muir Patent Law, PLLC

(57) ABSTRACT

A semiconductor package includes a lower package with a lower semiconductor chip on a lower package substrate, and an upper package with an upper semiconductor chip on an upper package substrate. The upper semiconductor chip has a plurality of chip pads and the upper package substrate has a plurality of substrate pads. The upper package is stacked on the lower package. The chip pads have a first pitch and the substrate pads have a second pitch greater than the first pitch. The upper package substrate has a plurality of connection lines that electrically connect the substrate pads to the chip pads.

17 Claims, 12 Drawing Sheets

(51) Int. Cl.
 *H01L 23/00* (2006.01)
 *H01L 25/07* (2006.01)
 *H01L 25/18* (2006.01)
 *H01L 25/00* (2006.01)

(52) U.S. Cl.
 CPC ............ *H01L 2924/15311* (2013.01); *H01L 2924/181* (2013.01); *H01L 2924/1815* (2013.01)

(56) References Cited

U.S. PATENT DOCUMENTS

| | | |
|---|---|---|
| 7,619,305 B2 | 11/2009 | Fan et al. |
| 7,960,840 B2 | 6/2011 | Bonifield et al. |
| 8,075,982 B2 | 12/2011 | Donahue |
| 8,080,445 B1 | 12/2011 | Pagaila |
| 8,263,434 B2 | 9/2012 | Pagaila et al. |
| 8,293,580 B2 | 10/2012 | Kim et al. |
| 8,304,913 B2 | 11/2012 | Nalla et al. |
| 8,314,490 B2 | 11/2012 | Yang |
| 8,389,339 B2 | 3/2013 | Tanuma et al. |
| 8,421,175 B2 | 4/2013 | Nicol |
| 8,436,462 B2 | 5/2013 | Kim et al. |
| 8,446,017 B2 | 5/2013 | Paek et al. |
| 2004/0229446 A1 | 11/2004 | Sorimachi |
| 2006/0157843 A1 | 7/2006 | Hwang |
| 2006/0244131 A1* | 11/2006 | Kobayashi ............ H01L 23/552 257/724 |
| 2008/0048316 A1 | 2/2008 | Robarts et al. |
| 2008/0284037 A1 | 11/2008 | Andry et al. |
| 2008/0315385 A1* | 12/2008 | Gerber ................. H01L 21/561 257/686 |
| 2009/0065920 A1 | 3/2009 | Ahn et al. |
| 2009/0152715 A1* | 6/2009 | Shim, II ................ H01L 21/568 257/737 |
| 2009/0261466 A1* | 10/2009 | Pagaila ............... H01L 21/6835 257/686 |
| 2010/0013073 A1 | 1/2010 | Andry et al. |
| 2010/0052135 A1* | 3/2010 | Shim, II ................ H01L 21/568 257/686 |
| 2010/0065948 A1 | 3/2010 | Bae et al. |
| 2010/0117201 A1 | 5/2010 | Ching et al. |
| 2010/0133704 A1 | 6/2010 | Marimuthu et al. |
| 2010/0230806 A1* | 9/2010 | Huang ................... H01L 23/50 257/723 |
| 2010/0276792 A1* | 11/2010 | Chi ........................ H01L 23/29 257/660 |
| 2010/0327419 A1 | 12/2010 | Muthukumar et al. |
| 2011/0037163 A1 | 2/2011 | Lachner et al. |
| 2011/0215458 A1 | 9/2011 | Camacho et al. |
| 2011/0254156 A1 | 10/2011 | Lin |
| 2011/0284936 A1 | 11/2011 | Choi et al. |
| 2011/0298109 A1* | 12/2011 | Pagaila ................... H01L 21/56 257/660 |
| 2011/0304349 A1 | 12/2011 | Stillman et al. |
| 2011/0317381 A1 | 12/2011 | Kim et al. |
| 2012/0025389 A1 | 2/2012 | Chu et al. |
| 2012/0032314 A1 | 2/2012 | Chen et al. |
| 2012/0056321 A1 | 3/2012 | Pagaila |
| 2012/0063190 A1 | 3/2012 | Koh |
| 2012/0074581 A1 | 3/2012 | Guzek et al. |
| 2012/0110402 A1 | 5/2012 | Wang et al. |
| 2012/0153494 A1 | 6/2012 | Manepalli et al. |
| 2012/0182650 A1 | 7/2012 | Chi |
| 2012/0319286 A1* | 12/2012 | Yang .................. H01L 23/3128 257/773 |
| 2013/0099385 A1* | 4/2013 | Chen .................. H01L 23/3128 257/773 |
| 2013/0154108 A1* | 6/2013 | Lin ..................... H01L 23/5389 257/774 |
| 2013/0270685 A1* | 10/2013 | Yim ....................... H01L 23/10 257/686 |

FOREIGN PATENT DOCUMENTS

| | | |
|---|---|---|
| JP | 2010-103519 | 5/2010 |
| KR | 10-2000-0032827 | 6/2000 |
| KR | 10-2005-0073678 | 7/2005 |
| KR | 10-652397 | 12/2006 |
| KR | 10-2007-0022097 | 2/2007 |
| KR | 10-2010-0006898 | 1/2010 |

* cited by examiner

SEMICONDUCTOR PACKAGES HAVING PACKAGE-ON-PACKAGE STRUCTURES

CROSS-REFERENCE TO RELATED APPLICATIONS

This application is a Divisional Application and claims the benefits of priority from U.S. application Ser. No. 14/178,747 filed on Feb. 12, 2014 and under 35 U.S.C. § 119 to Korean Patent Application 10-2013-0035310, filed on Apr. 1, 2013, the disclosures of both applications incorporated herein in their entirety by reference.

BACKGROUND

1. Field

An embodiment of the present inventive concept relates to semiconductors and, more particularly, to semiconductor packages having package-on-package structures.

2. Description of the Related Art

In the semiconductor industry, various package technologies have been developed to meet demands for large storage, thin thickness, and small size of semiconductor devices and/or electronic appliances. One approach is a package technology through which semiconductor chips are vertically stacked to realize a high density chip stacking. This package technology can integrate many kinds of semiconductor chips in smaller areas compared to a general package with a single semiconductor chip.

However, a problem with using a multi-chip stack package is that there is a strong possibility of a reduction in yield compared to using a single chip package. A package-on-package (POP) technology was developed to solve the problem with the reduction in yield and to still realize a high density chip stack. In using POP technology, known good packages are stacked to reduce the inferiority of the final product. This POP type package can be used to meet the trend toward both compact size of electronic portable appliances and multiple functions of mobile products.

System-in-Package (SiP) is another packing technology. The SiP structure also presents a possibility of a reduction in yield but, unlike the POP structure, does not restrict the selection of chips. Thus, there may be a need to improve the POP type semiconductor package to include the merits described above.

SUMMARY

The present inventive concept provides semiconductor packages having through electrodes and methods of fabricating the same in which a narrower pitch may expand to a wider pitch without interposers.

Additional features and utilities of the present general inventive concept will be set forth in part in the description which follows and, in part, will be obvious from the description, or may be learned by practice of the general inventive concept.

The foregoing and/or other features and utilities of the present general inventive may be achieved by providing semiconductor packages having through electrodes and methods of fabricating the same in which a package substrate and a semiconductor chip are electrically directly connected to each other without micro-bumps and/or through electrodes.

The foregoing and/or other features and utilities of the present general inventive may be achieved by providing semiconductor packages having through electrodes and methods of fabricating the same in which there is no gap between the package substrate and the semiconductor chip.

The foregoing and/or other features and utilities of the present general inventive may be achieved by providing a semiconductor package that has a lower package including a lower semiconductor chip on a lower package substrate, and an upper package including an upper semiconductor chip on an upper package substrate. The upper semiconductor chip may have a plurality of chip pads and the upper package substrate may have a plurality of substrate pads. The upper package may be stacked on the lower package. The chip pads may have a first pitch and the substrate pads may have a second pitch greater than the first pitch. The upper package substrate may comprise a plurality of connection lines that electrically connect the substrate pads to the chip pads.

In an embodiment, the semiconductor package may further comprise a plurality of connection terminals that electrically connect the upper package to the lower package. The connection terminals may be provided between the upper package and the lower package.

In an embodiment, the lower package may further comprise a lower mold layer and a plurality of connection patterns on the lower mold layer. The connection patterns may be electrically connected to the connection lines.

In an embodiment, the lower mold layer may comprise an opening exposing a portion of the lower package substrate. The connection patterns may extend toward inside the opening to be electrically connected to the lower package substrate.

In an embodiment, the opening may comprise at least one of a line-type trench and a plurality of holes arranged along lateral sides of the lower semiconductor chip.

The foregoing and/or other features and utilities of the present general inventive concept may be achieved by providing a semiconductor package that has a lower package including a lower package substrate, a lower semiconductor chip mounted on the lower package substrate, a lower mold layer encapsulating the lower semiconductor chip, and connection patterns on the lower mold layer that penetrate the lower mold layer to be electrically connected to the lower package substrate, an upper package including an upper package substrate having substrate pads, and an upper semiconductor chip mounted on the upper package substrate, the upper package being stacked on the lower package, and connection terminals interposed between the lower and upper packages, the connection terminals electrically connecting the lower and upper packages. The upper semiconductor chip may include chip pads having a pitch narrower than a pitch of the substrate pads. The upper package substrate may include connection lines that provide electrical paths between the substrate pads and the chip pads. The connection lines may allow the chip pads to access a wider pitch of the substrate pads to electrically connect the upper semiconductor chip to the lower package substrate.

In an embodiment, the lower package substrate may comprise circuit patterns electrically connected to the connection patterns. The lower mold layer may comprise an opening that is spaced apart from a lateral side of the lower semiconductor chip and vertically penetrates the lower mold layer to expose the circuit patterns. The connection patterns may extend toward the lower package substrate to pass through the opening to be electrically connected to the circuit patterns.

In an embodiment, the upper semiconductor chip may be disposed on the upper package substrate while a surface of the upper semiconductor chip faces the upper package substrate. The surface of the upper semiconductor chip may contact the upper package substrate.

In an embodiment, the lower package further may include internal terminals provided between the lower semiconductor chip and the lower package substrate. The lower semiconductor chip may be disposed on the lower package substrate to be electrically connected thereto through the internal terminals while a surface of the lower semiconductor chip faces the lower package substrate.

In an embodiment, the lower semiconductor chip may comprise a logic chip and the upper semiconductor chip may comprise a memory chip.

The foregoing and/or other features of the present general inventive concept may be achieved by providing a semiconductor package that has a package-on-package type package including lower and upper packages vertically stacked and electrically connected. The lower package may comprise a lower semiconductor chip mounted on a lower package substrate and encapsulated by a lower mold layer. The upper package may comprise an upper semiconductor chip having chip pads mounted on an upper package substrate without a gap between the upper semiconductor chip and the upper package substrate. The upper package substrate may include connection lines electrically connected to the upper semiconductor chip. The connection lines may be configured to provide the chip pads with access to a wider pitch to electrically connect the upper semiconductor chip to the lower package substrate.

In an embodiment, the upper package substrate may comprise substrate pads having a pitch greater than a pitch of the chip pads.

In an embodiment, the package-on-package type package may further comprise connection terminals provided between the lower and upper packages. The lower package may further comprise connection patterns disposed on the lower mold layer to be electrically connected to the connection terminals.

In an embodiment, the connection patterns may penetrate through the lower mold layer to be electrically connected to the lower package substrate.

In an embodiment, the lower package may further comprise an opening that penetrates through the lower mold layer and provides the connection patterns with paths toward the lower package substrate. The opening may comprise at least one of a line-type trench extending along lateral sides of the lower semiconductor chip and a plurality of holes arranged along the lateral sides of the lower semiconductor chip.

The foregoing and/or other features of the present general inventive concept may be achieved by providing as electronic system including a semiconductor memory having a first package including a first semiconductor chip on a first substrate, and a second package electrically connected to the first package and including a second semiconductor chip, with chip pads having a first pitch, on a second substrate with substrate pads having a second pitch greater than the first pitch, the chip pads electrically connected to the substrate pads by connection lines, and a memory controller electrically connected to the semiconductor memory and configured to write in data to and to read the data from at least one of the first semiconductor chip and the second semiconductor chip.

In an embodiment, the second package may exclude micro-bumps between the second semiconductor chip and the second substrate.

In an embodiment, the first semiconductor chip may be embedded in the first substrate.

In an embodiment, the substrate pads may be located at one of a center of, an edge of, a specific region of, and uniformly across a lower surface of the second substrate, and the chip pads are located at one of a center of, an edge of, and uniformly across an active surface of the second semiconductor chip.

In an embodiment, the electronic system may further include a system bus, a central processing unit electrically connected to the system bus, a random-access memory electrically connected to the system bus, a user interface electrically connected to the system bus, and a modem electrically connected to the system bus, and the memory controller may be electrically connected to the system bus.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1A:
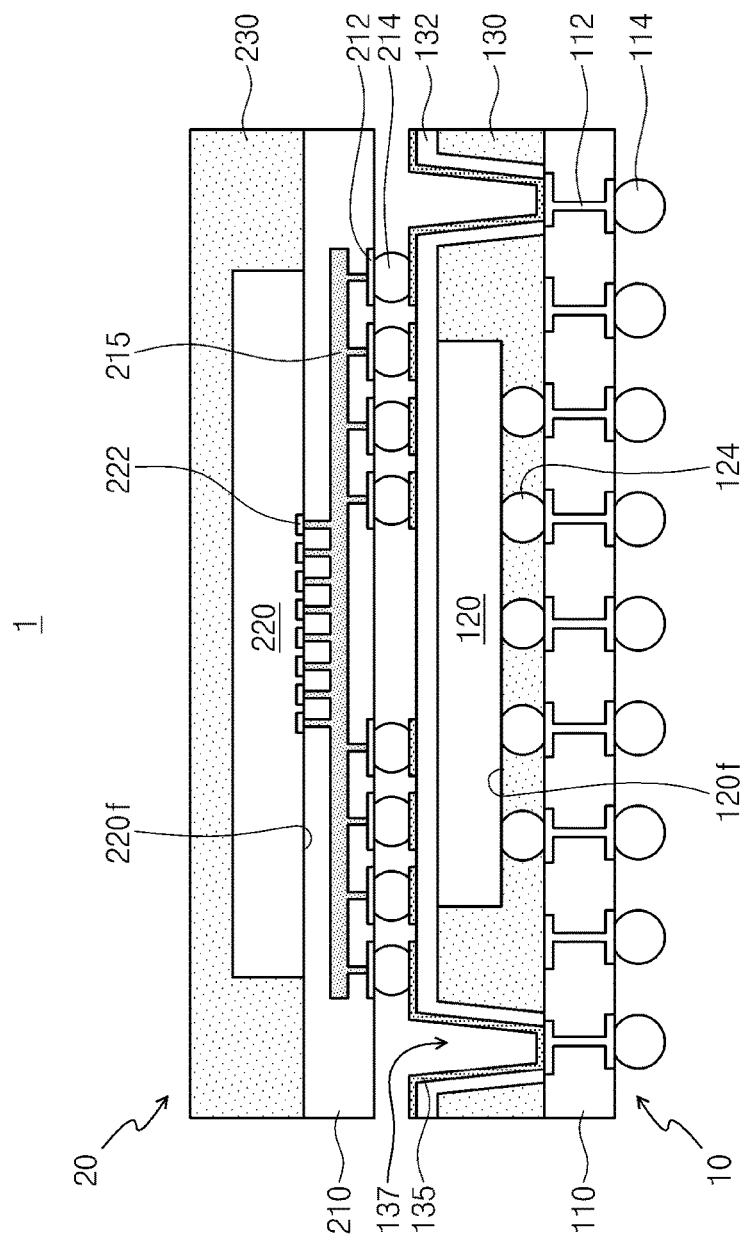
FIG. 1A is a cross sectional view illustrating a semiconductor package according to an embodiment of the present inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. Example embodiments, may, however, be embodied in many different forms and should not be construed as being limited to the embodiments set forth herein; rather, these example embodiments are provided so that this disclosure will be thorough and complete, and will fully convey the scope of example embodiments of the present inventive concept to those of ordinary skill in the art. In the drawings, the thicknesses of layers and regions are exaggerated for clarity.

Figure 1B:
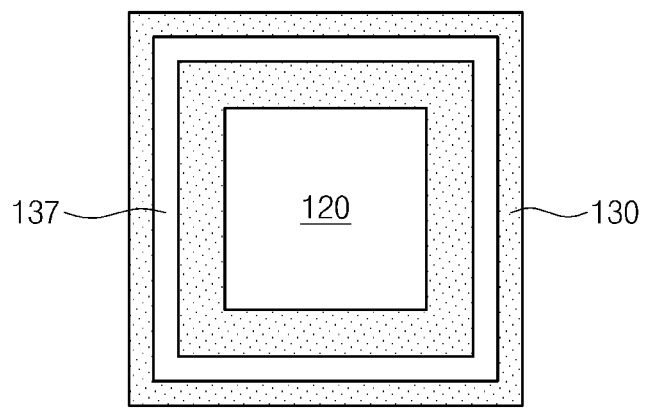
FIGS. 1B to 1E are plan views illustrating various examples of an opening of the semiconductor package according to an embodiment of the present inventive concept.
Figure 1C:
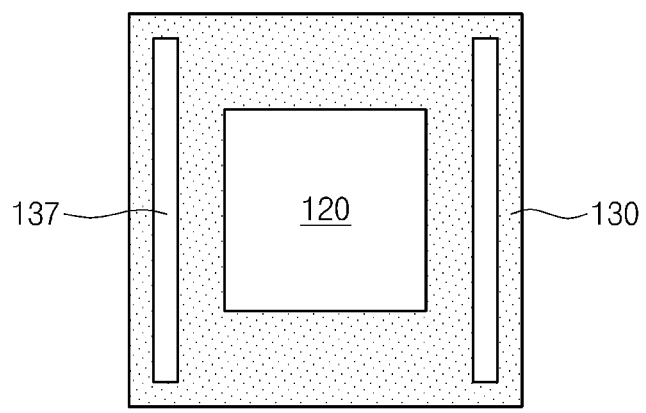
Figure 1D:
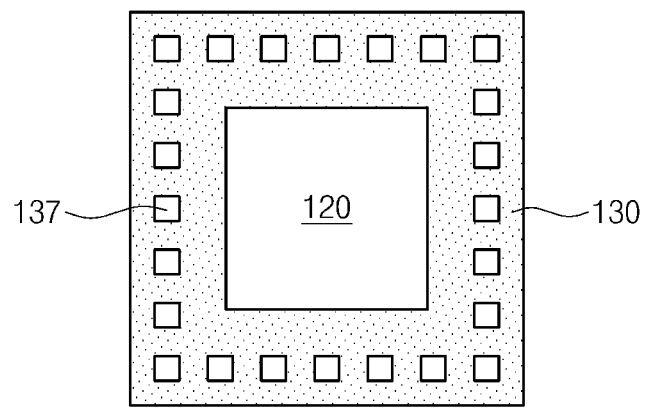
Figure 1E:
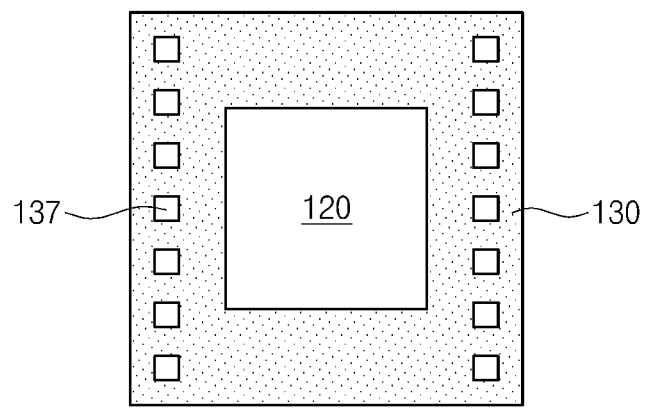
Figure 1F:
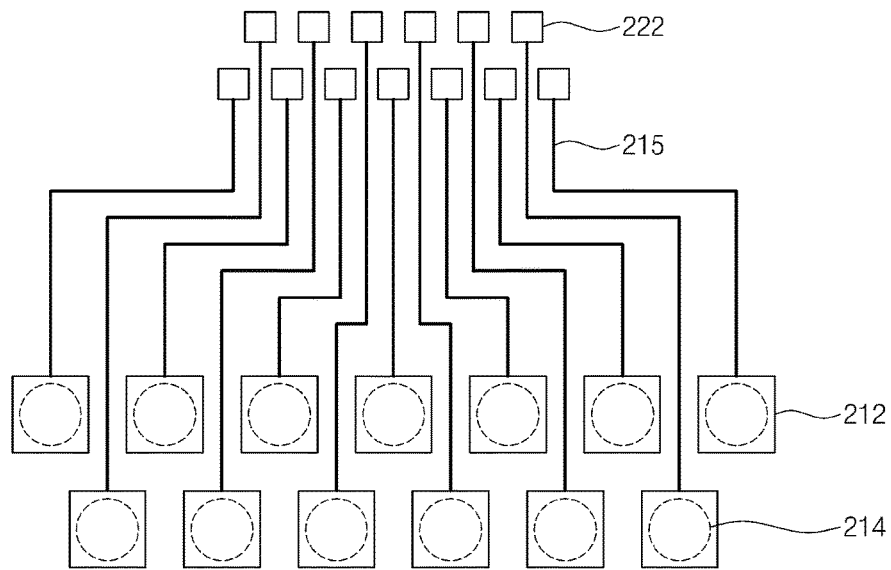
FIG. 1F is a schematic diagram illustrating an electrical connection in an upper package of the semiconductor package according to an embodiment of the present inventive concept.
Figure 1G:
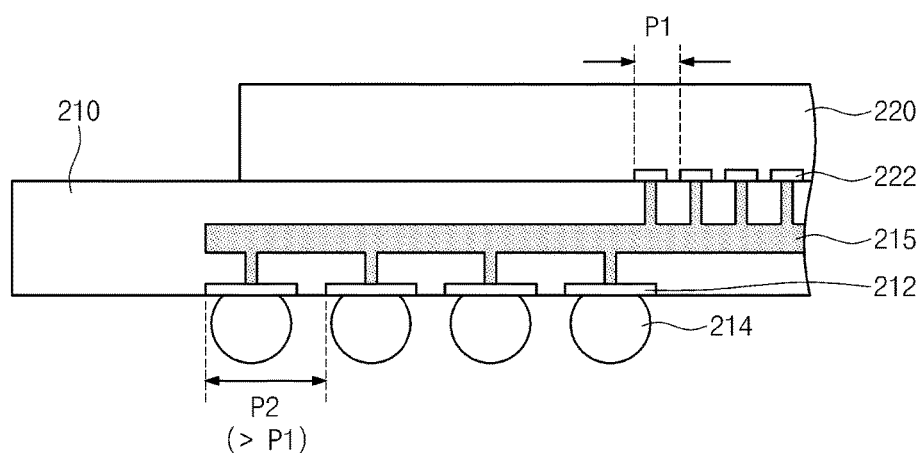
FIG. 1G is a cross sectional view illustrating a portion of the upper package included in the semiconductor package according to an embodiment of the present inventive concept.

FIG. 1A is a cross sectional view illustrating a semiconductor package 1 according to an embodiment of the present inventive concept. FIGS. 1B to 1E are plan views illustrating various examples of an opening 137 of the semiconductor package 1 according to an embodiment of the present inventive concept. FIG. 1F is a schematic diagram illustrating an electrical connection in an upper package 20 of the semiconductor package 1 according to an embodiment of the present inventive concept. FIG. 1G is a cross sectional view illustrating a portion of the upper package 20 included in the semiconductor package 1 according to exemplary embodiments of the present inventive concepts.

Referring to FIG. 1A, the semiconductor package 1 may be a package-on-package type package that includes the upper package 20 stacked on a lower package 10. For example, the lower package 10 may comprise a lower package substrate 110, a lower semiconductor chip 120 disposed on the lower package substrate 110, and a lower mold layer 130 that encapsulates the lower semiconductor chip 120. The upper package 20 may comprise an upper package substrate 210, an upper semiconductor chip 220 disposed on the upper package substrate 210, and an upper mold layer 230 that encapsulates the upper semiconductor chip 220. The upper semiconductor chip 220 and the lower semiconductor chip 120 may be a same or a different kind of chip. For example, the upper semiconductor chip 220 may be a memory chip and the lower semiconductor chip 120 may be a logic chip.

The lower semiconductor chip 120 may be bonded onto the lower package substrate 110, which has circuit patterns 112, in a flip-chip manner in which an active surface 120$f$ faces the lower package substrate 110, and may be electrically connected to the lower package substrate 110 through one or more internal terminals 124. The circuit patterns 112 may provide electrical paths that vertically penetrate the lower package substrate 110. The lower mold layer 130 may comprise the at least one vertical opening 137 that exposes the circuit patterns 112.

The opening 137 may have, for example, a trench shape or a hole shape. For example, the opening 137 may have a ring-type trench shape that continuously extends along lateral sides of the lower semiconductor chip 120 as illustrated in FIG. 1B, or a line-type trench shape that extends along opposing lateral sides of the lower semiconductor chip 120 as illustrated in FIG. 1C. Alternatively, the opening 137 may have, for example, a hole shape that includes a plurality of holes arranged continuously along lateral sides of the lower semiconductor chip 120 as illustrated in FIG. 1D, or arranged along opposing lateral sides of the lower semiconductor chip 120 as illustrated in FIG. 1E.

A plurality of connection patterns 135 may be disposed on the lower mold layer 130 to be electrically connected to the circuit patterns 112. The connection patterns 135 may extend toward inside the opening 137 to be directly coupled to the circuit patterns 112 such that the connection patterns 135 may be electrically connected to the lower package substrate 110.

An insulation layer 132 may be further provided between the lower mold layer 130 and the connection patterns 135. For example, when the lower mold layer 130 is formed to expose the lower semiconductor chip 120, the insulation layer 132 may prevent an electrical interconnection between the connection patterns 135 and the lower semiconductor chip 120. A sidewall of the opening 137 may be covered by the insulation layer 132. However, a bottom floor of the opening 137 may not be covered by the insulation layer 132 such that the circuit patterns 112 may be exposed through the opening 137. The lower package substrate 110 may further comprise one or more external terminals 114 coupled to the circuit patterns 112.

The lower semiconductor chip 120 may be mounted in a flip-chip manner on the lower package substrate 110, the lower mold layer 130 may be formed and patterned to form the opening 137, and the connection patterns 135 may be formed on the lower mold layer 130, which may fabricate the lower package 10. Before the connection patterns 135 are formed, the lower mold layer 130 may be grinded to expose the lower semiconductor chip 120 and thereafter the insulation layer 132 may be further formed.

The upper semiconductor chip 220 may be formed and then the upper package substrate 210 may be formed on an active surface 220$f$ of the upper semiconductor chip 220, and the upper mold layer 230 may be formed to encapsulate the upper semiconductor chip 220, which may fabricate the upper package 20. In other words, the upper package 20 may be fabricated by forming the upper semiconductor chip 220, depositing an insulating material to form the upper package substrate 210 on the upper semiconductor chip 220, and depositing and patterning a metal layer to form connection lines 215 embedded in the upper package substrate 210, rather than by mounting the upper semiconductor chip 220 on the upper package substrate 210.

The upper semiconductor chip 220 may further comprise chip pads 222 electrically connected to the connection lines 215, and the upper package substrate 210 may further comprise substrate pads 212 coupled to the connection lines 215. In an embodiment, the upper semiconductor chip 220 may be a wide input/output (I/O) memory chip that includes about 128 or more chip pads 222. The substrate pads 212 may be arranged, for example, uniformly and entirely on a lower surface of the upper package substrate 210. Alternatively, the substrate pads 212 may be arranged, for example, locally on a center, an edge, or a specific region of the lower surface of the upper package substrate 210. The connection lines 215 may provide vertical electrical paths between the chip pads 222 and the substrate pads 212, as illustrated in FIG. 1F. Connection terminals 214 may be further provided to be coupled to the substrate pads 212. The connection terminals 214 may be attached to the upper package substrate 210.

Because the upper package substrate 210 and the upper semiconductor chip 220 may be directly or indirectly contacted to each other, there may be no gap between the upper package substrate 210 and the upper semiconductor chip 220. Because the connection lines 215 and the chip pads 222 may be directly connected to each other, the upper package substrate 210 and the upper semiconductor chip 220 may be electrically connected to each other without an electrical medium such as, for example, micro-bumps. The connection lines 215 may be electrically connected to the connection patterns 135 via the connection terminals 214. Consequently, the connection terminals 214 may electrically connect the upper package 20 to the lower package 10.

Referring to FIG. 1G, the connection lines 215 may expand a pitch of the chips pad 222. For example, the connection lines 215 may electrically connect the chip pads 222 that has a first pitch P1 to the substrate pads 212 that has a second pitch P2. The second pitch P2 may be greater than the first pitch P1, as illustrated in FIG. 1G. In an embodiment, the first pitch P1 of the chip pad 222 may be 60 μm or less, the second pitch P2 of the substrate pad 212 may be 120 μm or more. The connection terminals 214 may be arranged to have a pitch that may be identical to or similar to the second pitch P2. According to an embodiment, the upper semiconductor chip 220 may be electrically connected to the upper package substrate 210 without an electrical medium such as, for example, micro-bumps or through electrodes. The connection lines 215 may expand the narrower pitch P1 of the chip pad 222 to the wider pitch P2 of the connection terminal 214 without the help of an interposer, and the connection terminals 214 may electrically connect the upper package 20 to the lower package 10.

As described above, because there may no gap between the upper semiconductor chip 220 and the upper package substrate 210, a total height of the semiconductor package 1 may be reduced. Because there may be no need to form micro-bumps between the upper semiconductor chip 220 and the upper package substrate 210, there may be no electrical and/or mechanical problems due to, for example, electromigration and/or an intermetallic compound of micro-bumps. In addition, because there may be no interposer, processes to form the interposer and through electrodes therethrough may be skipped.

FIGS. 2A to 2F are cross sectional views illustrating semiconductor packages according to embodiments of the present inventive concept. In order to keep the description concise, previously described elements may be identified by similar or identical reference numbers without repeating overlapping descriptions thereof.

Figure 2A:
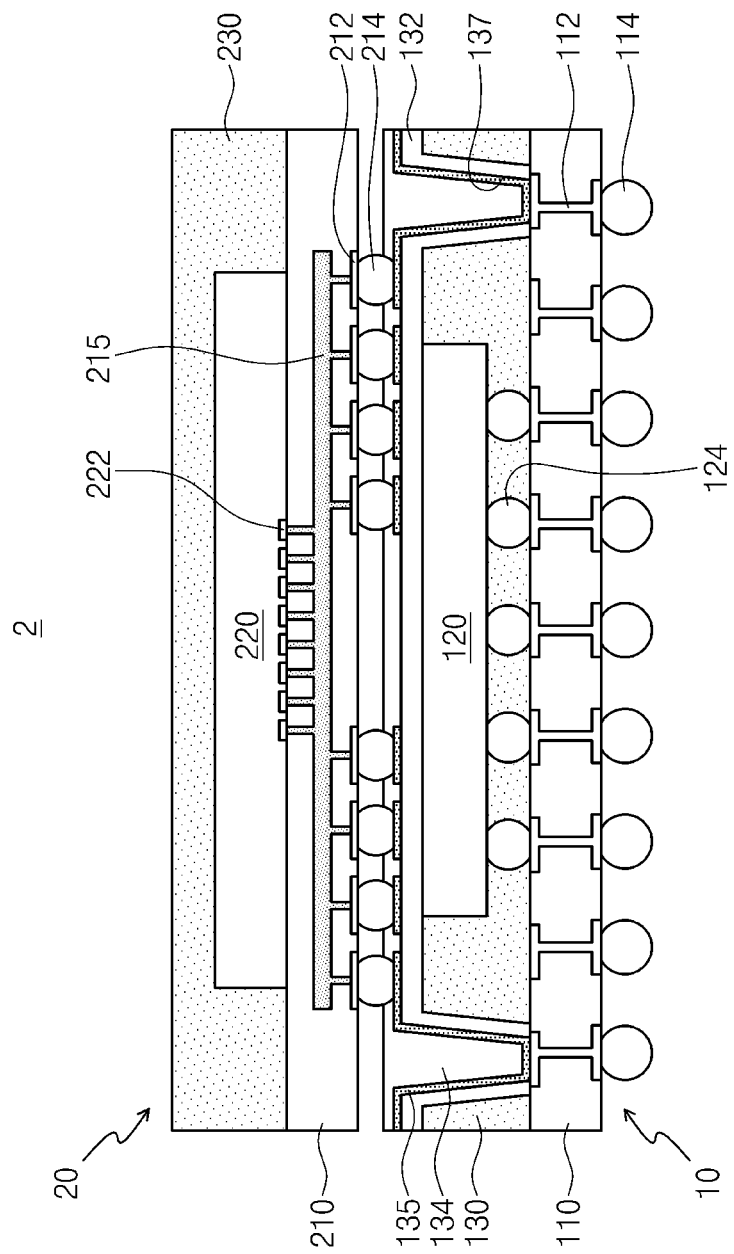
FIGS. 2A to 2F are cross sectional views illustrating semiconductor packages according to embodiments of the present inventive concept.

Referring to FIG. 2A, a semiconductor package 2 may further comprise a filling-up insulation layer 134 that fills the opening 137 and covers the connection patterns 135 in the opening 137. The filling-up insulation layer 134 may further extend from the opening 137 toward a center of the lower semiconductor chip 120 to cover the insulation layer 132.

Figure 2B:
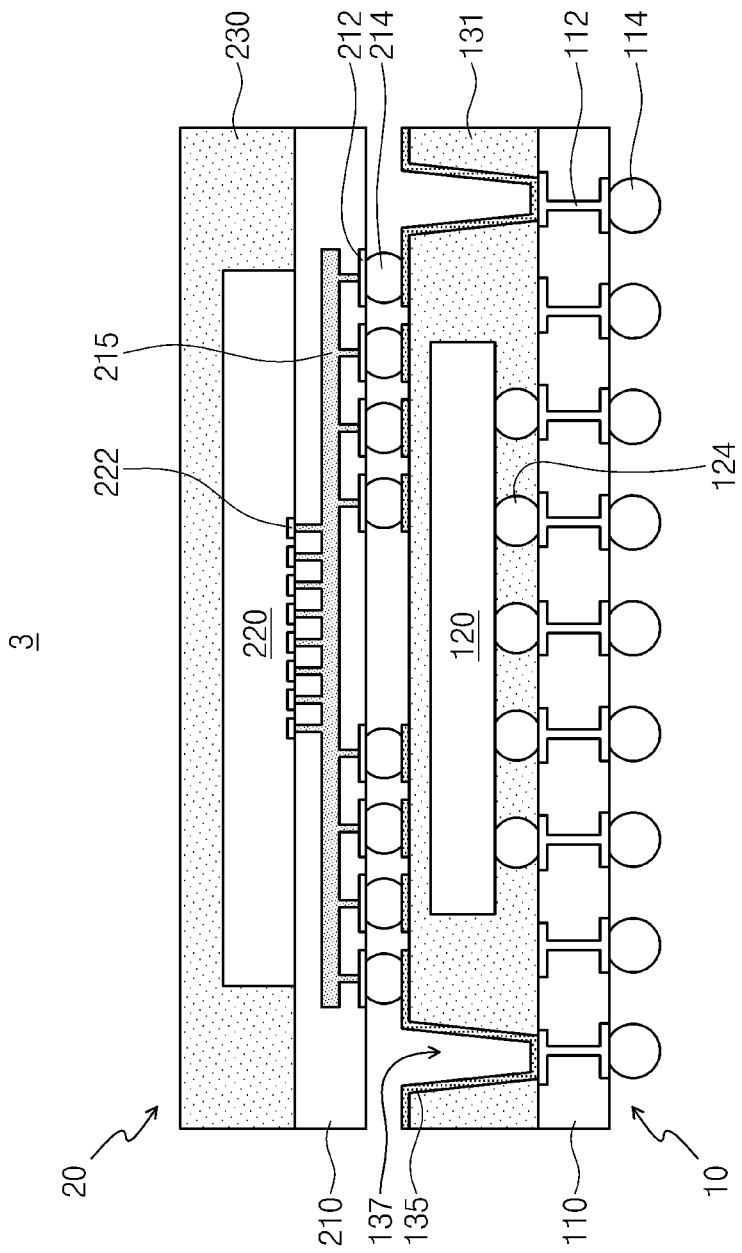

Referring to FIG. 2B, a semiconductor package 3 may comprise a lower mold layer 131 that covers lateral sides and top surfaces of the lower semiconductor chip 120. Therefore, there may be no need to form the insulation layer 132 of the embodiment illustrated in FIG. 1A on the lower mold layer 131.

Figure 2C:
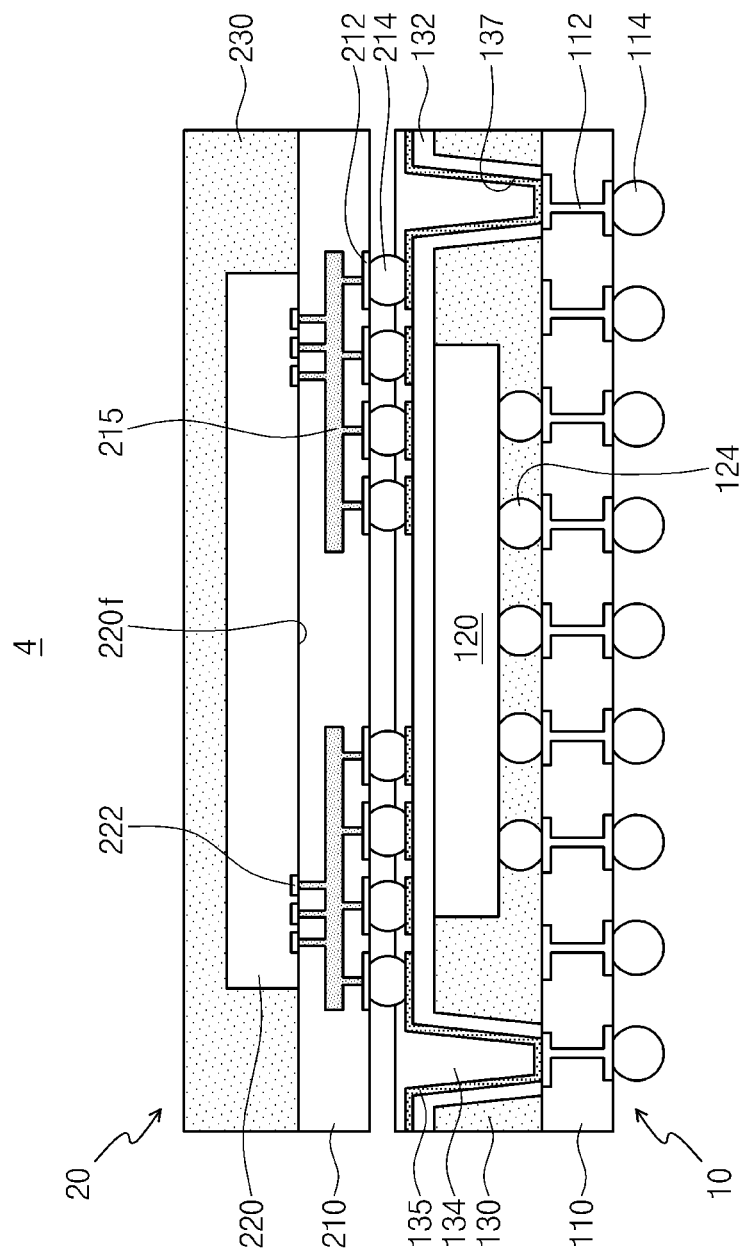

Referring to FIG. 2C, a semiconductor package 4 may comprise the upper semiconductor chip 220 that has an edge pad structure. For example, the semiconductor chip 220 may include the chip pads 222 arranged locally on an edge of the active surface 220f of the upper semiconductor chip 220.

Figure 2D:
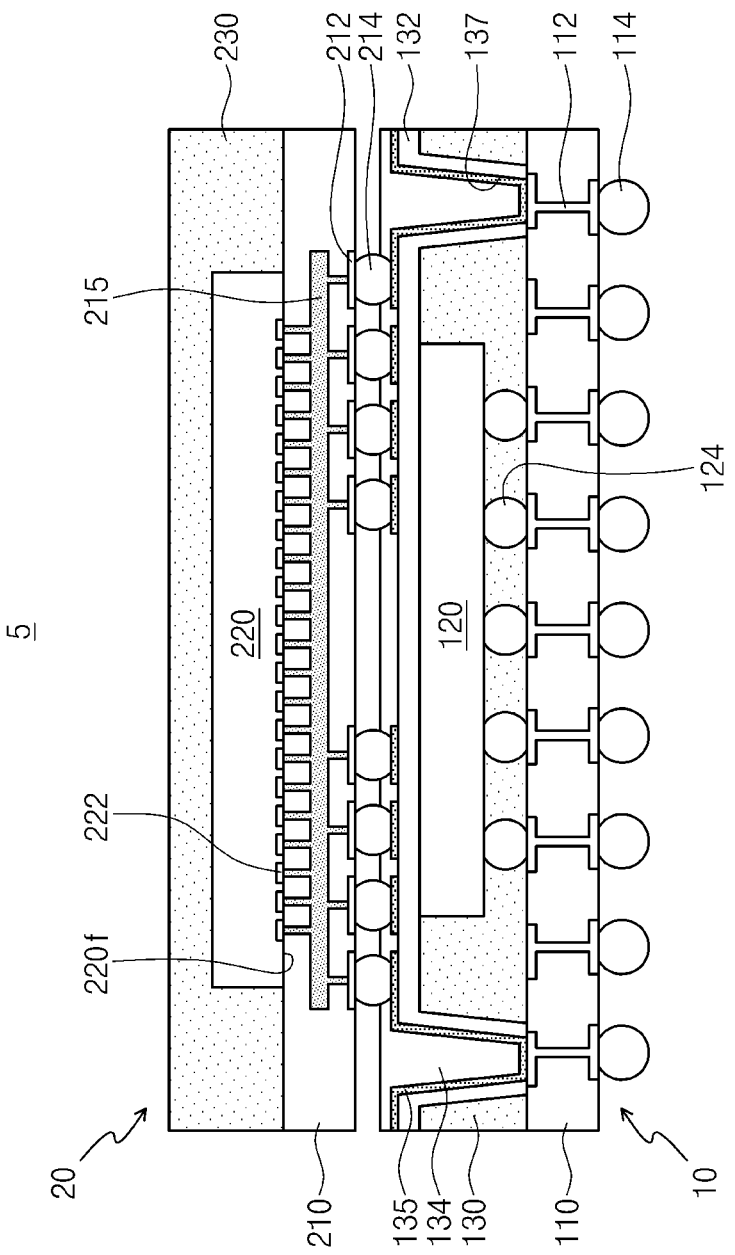

Referring of FIG. 2D, a semiconductor package 5 may comprise the upper semiconductor chip 220 that has a full matrix structure. For example, the upper semiconductor chip 220 may include the chip pads 222 arranged uniformly on the entire active surface 220f of the upper semiconductor chip 220.

Figure 2E:
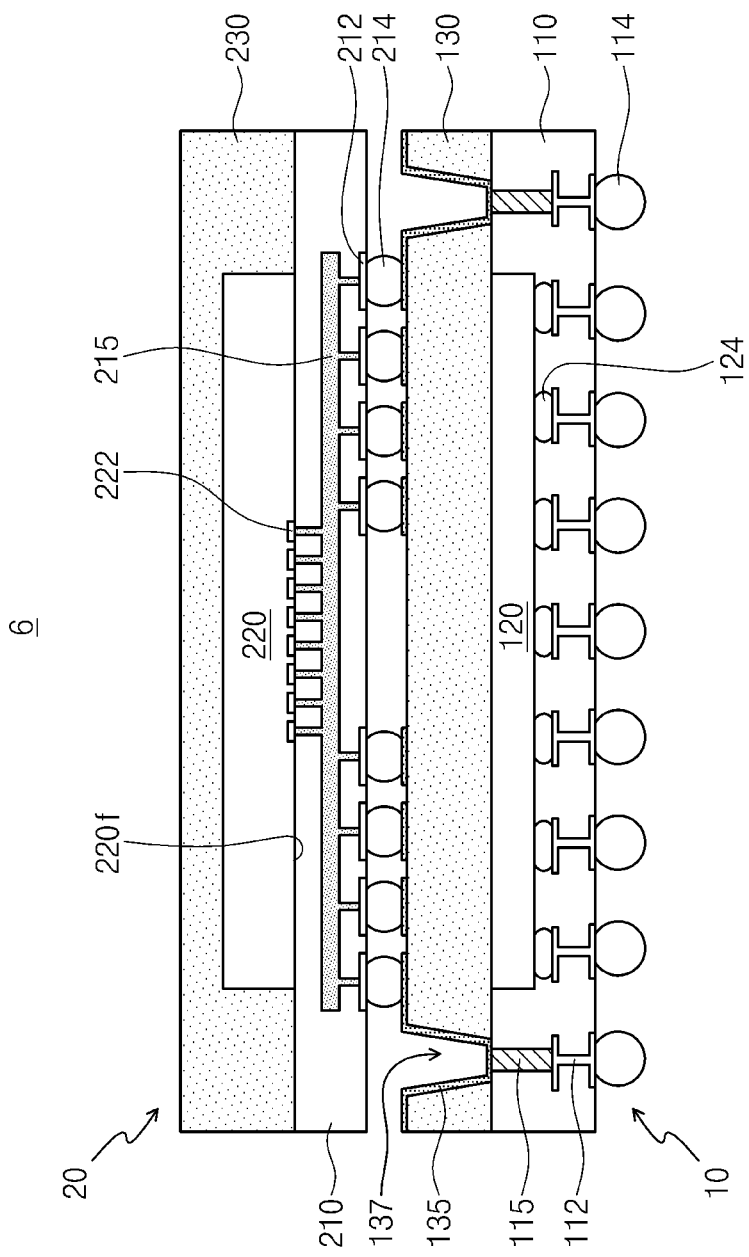

Referring of FIG. 2E, a semiconductor package 6 may comprise the lower semiconductor chip 120 embedded in the lower package substrate 110 that has vias 115. The lower semiconductor chip 120 may be electrically connected to the circuit patterns 112 through the internal terminals 124, the circuit patterns 112 may be electrically connected to the connection patterns 135 through the vias 115. Consequently, the lower package 10 may be electrically connected to the upper package 20 through the connection patterns 135.

Figure 2F:
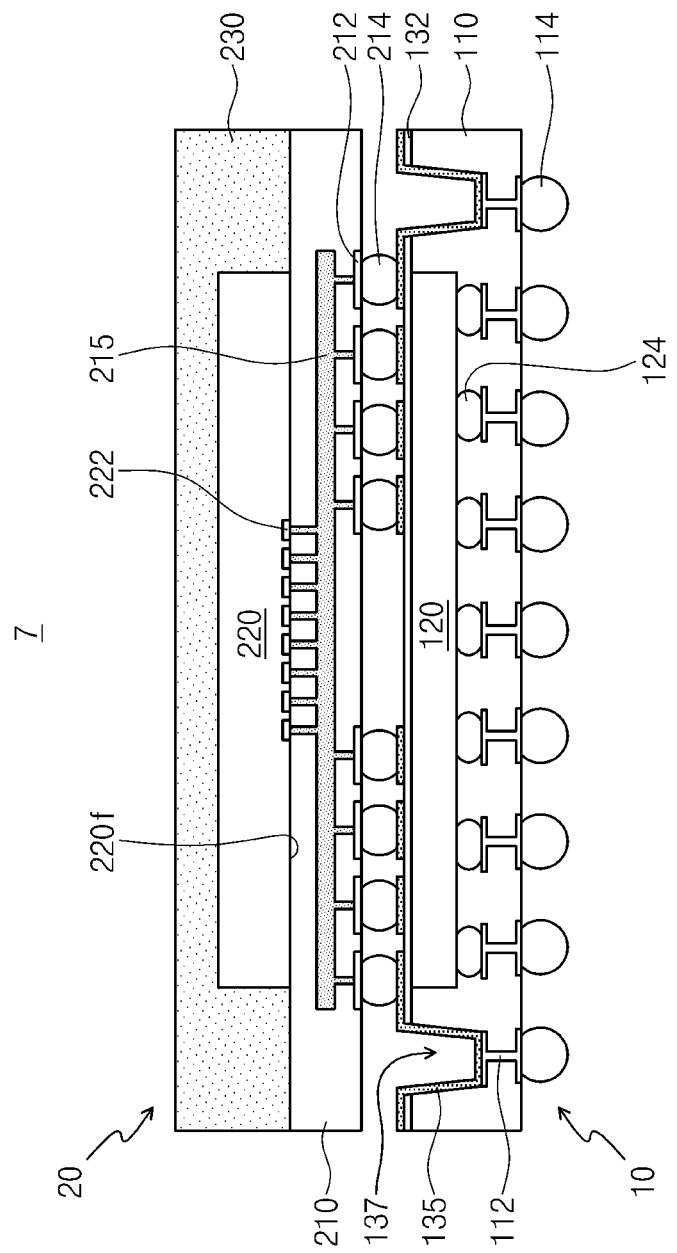

Referring to FIG. 2F, a semiconductor package 7 may comprise the lower semiconductor chip 120 embedded in the lower package substrate 110 that has the connection patterns 135 formed therein. For example, the connection patterns 135 may be provided on the lower package substrate 110, and the opening 137 that exposes the circuit patterns 112 may be arranged along an edge of the lower package substrate 110. The lower semiconductor chip 120 may be exposed through a top surface of the lower package substrate 110, and the insulation layer 132 may be further provided between the lower semiconductor chip 120 and the connection patterns 135 to electrically insulate the connection patterns 135 from the lower semiconductor chip 120. In an embodiment, the semiconductor package 7 may exclude the lower mold layer 130 of the embodiment illustrated in FIG. 1A. Therefore, the semiconductor package 7 may have a reduced total height with respect to the case in which the lower mold layer 130 is included.

Figure 3A:
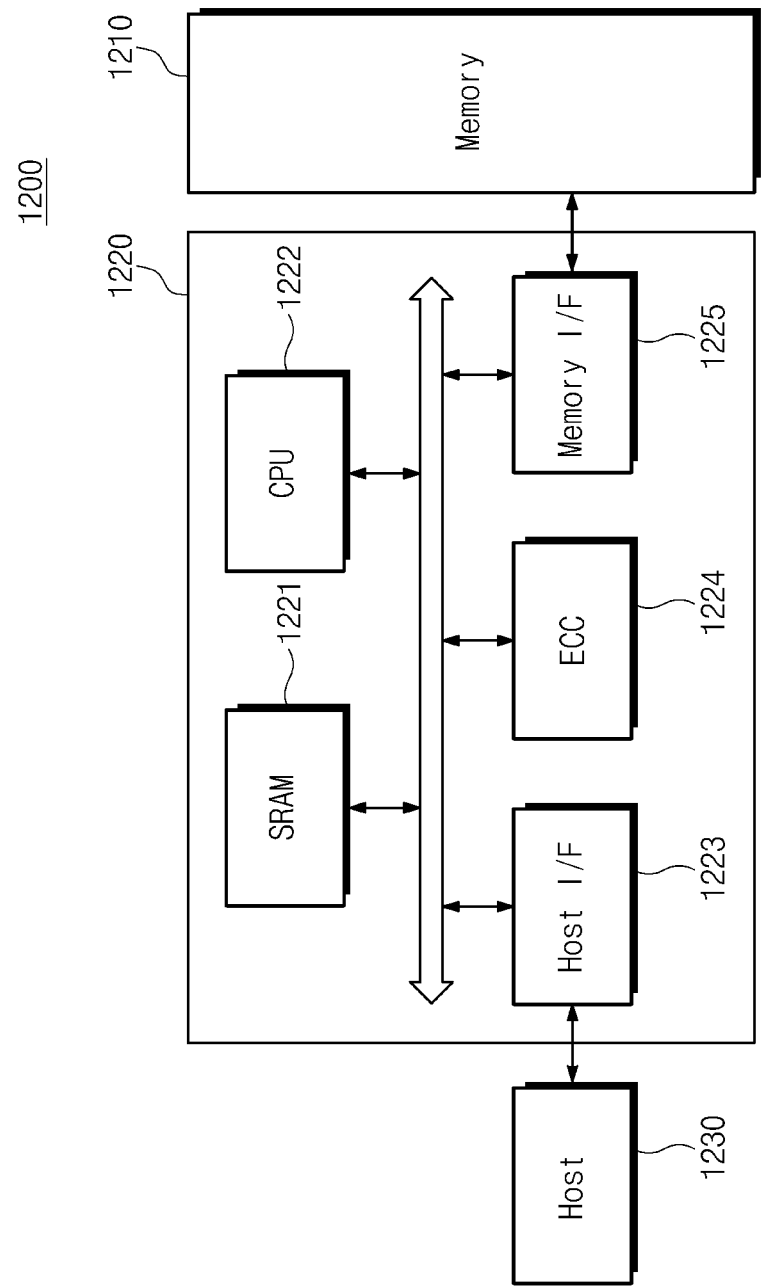
FIG. 3A is a schematic block diagram illustrating an example of a memory card that includes a semiconductor package according to embodiments of the present inventive concept.
Figure 3B:
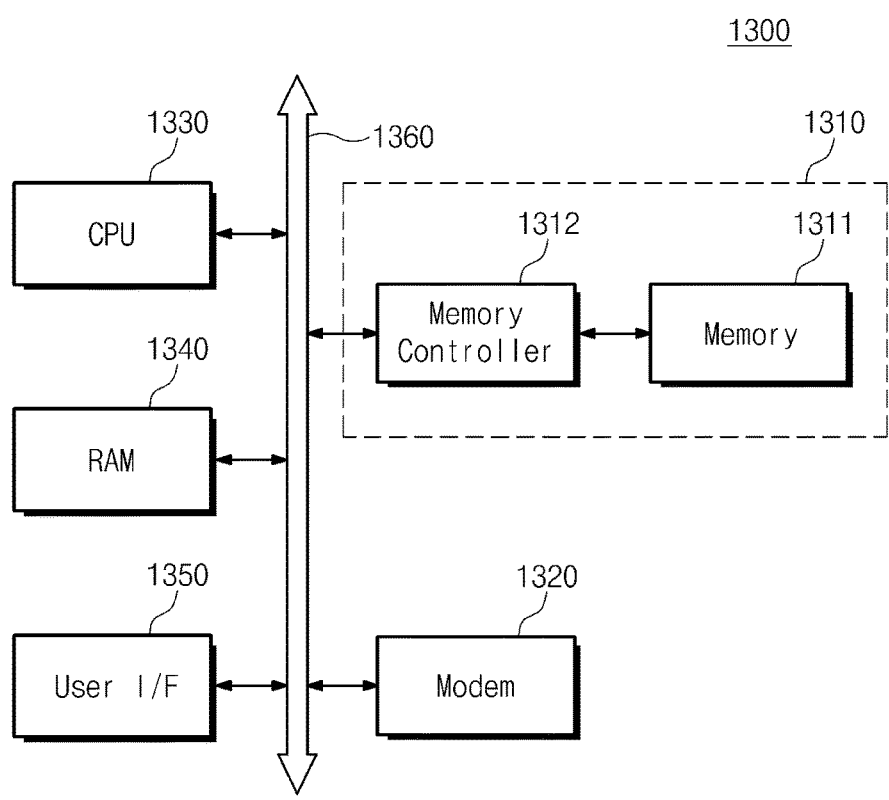
FIG. 3B is a schematic block diagram illustrating an example of an information process system that includes a semiconductor package according to embodiments of the present inventive concept.

FIG. 3A is a schematic block diagram illustrating an example of a memory card 1200 that includes a semiconductor package according to embodiments of the present inventive concept. FIG. 3B is a schematic block diagram illustrating an example of an information process system 1300 that includes a semiconductor package according to embodiments of the present inventive concept.

Referring to FIG. 3A, a semiconductor memory 1210 that includes at least one of the semiconductor packages 1 to 7 according to embodiments of the present inventive concept may be applicable to the memory card 1200. For example, the memory card 1200 may include a memory controller 1220 that may generally control data exchange between a host 1230 and the semiconductor memory 1210. A Static Random-Access Memory (SRAM) 1221 may be used as a work memory of a central processing unit (CPU) 1222. A host interface (Host I/F) 1223 may have a data exchange protocol of the host 1230 connected to the memory card 1200. An error correction coding (ECC) block 1224 may detect and/or may correct errors of data that are read from the semiconductor memory 1210. A memory interface (Memory I/F) 1225 may interface with the semiconductor memory 1210 according to an embodiment. The CPU 1222 may generally control data exchange of the memory controller 1220.

Referring to FIG. 3B, the information processing system 1300 may include a memory system 1310 that has at least one of the semiconductor packages 1 to 7 according to embodiments of the present inventive concept. The information processing system 1300 may include, for example, a mobile device or a computer. For example, the information processing system 1300 may include a modem 1320, a central processing unit (CPU) 1330, a Random-Access Memory (RAM) 1340, and a user interface (User I/F) 1350 electrically connected to the memory system 1310 via a system bus 1360. The memory system 1310 may include a memory 1311 and a memory controller 1312 and may have substantially the same configuration as that of the memory card 1200 in the embodiment illustrated in FIG. 3A. The memory system 1310 may store data processed by the CPU 1330 or data input from outside. The information process system 1300 may be provided, for example, as a memory card, a solid state disk, a semiconductor device disk, a camera image sensor, and/or other application chipsets. In an embodiment, the memory system 1310 may be used as a portion of a solid state drive (SSD), and in this case, the information processing system 1300 may stably and reliably store a large amount of data in the memory system 1310.

According to an embodiment of the present inventive concept, the upper semiconductor chip 220 may be electrically connected to the upper package substrate 210 without the help of, for example, micro-bumps such that the semiconductor package 1, 2, 3, 4, 5, 6, or 7 may be shrunk and the reliability of the semiconductor package 1, 2, 3, 4, 5, 6, or 7 may be improved. Moreover, there may be no need to form an interposer so that processes to form the interposer and through electrodes therethrough may be skipped, which may reduce fabrication cost. According to an embodiment, known good semiconductor packages may be stacked to fabricate a package-on-package type semiconductor package 1, 2, 3, 4, 5, 6, or 7 that has a good yield as compared with a different type semiconductor packaging technology such as, for example, system-in-package technology. Additionally, according to an embodiment of the present inventive concept, a designer may be free to select or choose the kinds of upper and lower semiconductor chips 220 and 120 that may be included in the semiconductor package 1, 2, 3, 4, 5, 6, or 7. Moreover, although seven specific embodiments of the present general inventive concept have been described herein, those skilled in the art will understand and appreciate additional embodiments that may be realized from the disclosures, teachings, and suggestions of the seven specific embodiments of the present general inventive concept have been described herein.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor package, comprising:
a lower package including a lower semiconductor chip on a lower package substrate;
an upper package, stacked on the lower package, including an upper semiconductor chip on an upper package substrate, the upper semiconductor chip having a plurality of chip pads and the upper package substrate having a plurality of substrate pads; and
connection terminals provided between the lower and upper packages,
wherein the chip pads have a first pitch and the substrate pads have a second pitch greater than the first pitch, and
wherein the upper package substrate comprises a plurality of connection lines that electrically connect the substrate pads to the chip pads,
wherein the lower package further including a lower mold layer and a plurality of connection patterns on the lower mold layer,
wherein the connection patterns are electrically connected to the connection lines,
wherein the lower mold layer comprises an opening exposing a portion of the lower package substrate, the opening being along a peripheral side of the lower mold layer and extending to a depth lower than that of the lower semiconductor chip on the lower package substrate,
wherein the connection patterns conformally extend along a sidewall of the opening to be electrically connected to the lower package substrate,
wherein the connection terminals are spaced apart from the opening in a plan view,
wherein the connection terminals are electrically connected to the substrate pads and the connection patterns, and
wherein the opening has a ring-type trench shape that continuously extends along lateral sides of the lower semiconductor chip and fully surrounds the lower semiconductor chip in the plan view.

2. The semiconductor package of claim 1, wherein the lower mold layer has a coplanar surface with the lower semiconductor chip.

3. The semiconductor package of claim 2, wherein an insulation layer covers the coplanar surface of the lower mold layer and the lower semiconductor chip, and wherein the insulation layer is disposed between the connection patterns and the sidewall of the opening.

4. The semiconductor package of claim 1, wherein no other conductive material is provided in the opening between opposing sidewalls of the connection patterns.

5. The semiconductor package of claim 1, further comprising a second insulation layer that fills the opening and covers the connection patterns in the opening.

6. A semiconductor package, comprising:
a lower package including a lower package substrate, a lower semiconductor chip mounted on the lower package substrate, a lower mold layer encapsulating the lower semiconductor chip, and connection patterns on the lower mold layer that penetrate the lower mold layer to be electrically connected to the lower package substrate;
an upper package including an upper package substrate having substrate pads, and an upper semiconductor chip mounted on the upper package substrate, the upper package being stacked on the lower package; and
connection terminals interposed between the lower and upper packages, the connection terminals electrically connecting the lower and upper packages,
wherein the upper semiconductor chip includes chip pads having a pitch narrower than a pitch of the substrate pads,
wherein the upper package substrate includes connection lines that provide electrical paths between the substrate pads and the chip pads,
wherein the connection lines allow the chip pads to access a wider pitch of the substrate pads to electrically connect the upper semiconductor chip to the lower package substrate,
wherein the lower package substrate comprises circuit patterns electrically connected to the connection patterns,
wherein the lower mold layer comprises an opening that is spaced apart from lateral sides of the lower semiconductor chip and vertically penetrates the lower mold layer to expose the circuit patterns,
wherein the connection patterns conformally extend along a sidewall of the opening toward the lower package substrate to pass through the opening to be electrically connected to the circuit patterns,
wherein the connection terminals are spaced apart from the opening in a plan view, and
wherein the opening has a ring-type trench shape that continuously extends along the lateral sides of the lower semiconductor chip and fully surrounds the lower semiconductor chip in the plan view.

7. The semiconductor package of claim 6, wherein the lower mold layer has a coplanar surface with the lower semiconductor chip, and wherein an insulation layer covers the coplanar surface of the lower mold layer and the lower semiconductor chip and is disposed between the lower mold layer and the connection patterns.

8. The semiconductor package of claim 6, wherein the upper semiconductor chip is disposed on the upper package substrate while a surface of the upper semiconductor chip faces the upper package substrate, and wherein the surface of the upper semiconductor chip contacts the upper package substrate.

9. The semiconductor package of claim 6, wherein the lower package further includes internal terminals provided between the lower semiconductor chip and the lower package substrate, and wherein the lower semiconductor chip is disposed on the lower package substrate to be electrically connected thereto through the internal terminals while a surface of the lower semiconductor chip faces the lower package substrate.

10. A semiconductor package comprising:

a package-on-package type package including lower and upper packages vertically stacked and electrically connected; and connection terminals interposed between the lower and upper packages, wherein the lower package comprises a lower semiconductor chip mounted on a lower package substrate and encapsulated by a lower mold layer, wherein the upper package comprises an upper semiconductor chip having chip pads mounted on an upper package substrate without a gap between the upper semiconductor chip and the upper package substrate, wherein the upper package substrate includes connection lines electrically connected to the upper semiconductor chip, the connection lines configured to provide the chip pads with access to a wider pitch to electrically connect the upper semiconductor chip to the lower package substrate, wherein the lower package further includes a plurality of connection patterns on the lower mold layer, wherein the connection patterns are electrically connected to the connection lines, wherein the lower mold layer comprises an opening exposing a portion of the lower package substrate, the opening being along a peripheral side of the lower mold layer and extending to a depth lower than that of the lower semiconductor chip on the lower package substrate, wherein the connection patterns conformally extend along a sidewall of the opening to be electrically connected to the lower package substrate, wherein the connection terminals are spaced apart from the opening in a plan view, wherein the connection patterns are electrically connected to the connection terminals, and wherein the opening has a ring-type trench shape that continuously extends along lateral sides of the lower semiconductor chip and fully surrounds the lower semiconductor chip in the plan view.

11. The semiconductor package of claim 10, wherein the upper package substrate comprises substrate pads having a pitch greater than a pitch of the chip pads.

12. The semiconductor package of claim 10, wherein the connection patterns penetrate through the lower mold layer to be electrically connected to the lower package substrate.

13. The semiconductor package of claim 12, wherein the opening penetrates through the lower mold layer and provides the connection patterns with paths toward the lower package substrate.

14. The semiconductor package of claim 10, wherein the upper package excludes micro-bumps between the upper semiconductor chip and the upper package substrate.

15. The semiconductor package of claim 11, wherein the substrate pads are located at one of a center of, an edge of, a specific region of, and uniformly across a lower surface of the upper package substrate, and the chip pads are located at one of a center of, an edge of, and uniformly across an active surface of the upper semiconductor chip.

16. The semiconductor package of claim 11, wherein the lower package further comprises:

the lower mold layer covering an upper surface of the lower package substrate, the lower semiconductor chip embedded in the lower mold layer and having an upper surface coplanar with an upper surface of the lower mold layer;

a circuit pattern providing an electrical connection between the upper surface of the lower package substrate and a lower surface of the lower package substrate; and internal terminals connecting the lower semiconductor chip to the circuit pattern located under the lower semiconductor chip, wherein the connection patterns provide an electrical connection between the substrate pads and the circuit pattern.

17. The semiconductor package of claim 16, wherein an insulation layer is disposed between the lower mold layer and the connection patterns.

* * * * *